United States Patent

Grodzki

(10) Patent No.: US 9,335,394 B2
(45) Date of Patent: May 10, 2016

(54) METHOD AND MAGNETIC RESONANCE SCANNER FOR HYPERINTENSE DISPLAY OF AREAS IN THE VICINITY OF DIPOLE FIELDS

(75) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 854 days.

(21) Appl. No.: 13/606,426

(22) Filed: Sep. 7, 2012

(65) Prior Publication Data

US 2013/0069648 A1    Mar. 21, 2013

(30) Foreign Application Priority Data

Sep. 14, 2011 (DE) .......................... 10 2011 082 669

(51) Int. Cl.
*G01R 33/56* (2006.01)
*G01R 33/34* (2006.01)
*G01R 33/48* (2006.01)

(52) U.S. Cl.
CPC ................ *G01R 33/56* (2013.01); *G01R 33/34* (2013.01); *G01R 33/4816* (2013.01); *G01R 33/5601* (2013.01); *G01R 33/5607* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 7,474,097 B2* | 1/2009 | Bydder et al. ................ | 324/307 |
| 7,602,184 B2* | 10/2009 | Du ................................ | 324/309 |
| 8,054,075 B2* | 11/2011 | Stuber ................ | G01R 33/4828 324/307 |
| 8,148,979 B1* | 4/2012 | Du ................................ | 324/307 |
| 9,007,061 B2* | 4/2015 | Stuber ................ | G01R 33/4828 324/307 |
| 2007/0080685 A1* | 4/2007 | Bydder et al. ................ | 324/309 |
| 2009/0009167 A1* | 1/2009 | Du ................................ | 324/307 |
| 2009/0027051 A1* | 1/2009 | Stuber ................ | G01R 33/4828 324/309 |
| 2009/0111140 A1 | 4/2009 | Liu et al. | |
| 2009/0264733 A1* | 10/2009 | Corum et al. ................. | 600/420 |
| 2012/0062227 A1* | 3/2012 | Stuber ................ | G01R 33/4828 324/309 |
| 2013/0069648 A1* | 3/2013 | Grodzki ........................ | 324/309 |

OTHER PUBLICATIONS

Sonia Nielles-Vallespin et al.; "3D Radial Projection Technique with Ultrashort Echo Times for Sodium MRI: Clinical Applications in Human Brain and Skeletal Muscle"; Magnetic Resonance in Medicine (2007), vol. 57, pp. 74-81.

D.M. Grodzki et al: "Single Point Sequences With Shortest Possible TE-Gospel", Magnetic Resonanc, Siemens Healthcare, Erlangen, Bavaria, Germany, Department of Experimental Physics 5, University of Würzburg, Würzburg, Bavaria, Germany.

J. H. Seppenwoolde et al: "Passive Tracking Exploiting Local Signal Conservation: The White Marker Phenomenon", Magnetic Resonance in Medicine 50:784-790 (2003).

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and magnetic resonance apparatus for the hyperintense display of areas containing particles of magnetically active substances, in an examination region in a measurement volume of a magnetic resonance scanner, measurement data from the examination area are generated by a pulse sequence and recorded, the pulse sequence causing an echo time of less than one millisecond, so that a suppression of undesired signals is also caused.

11 Claims, 4 Drawing Sheets

(56) References Cited

OTHER PUBLICATIONS

M. Stuber et al: "Positive Contrast Visualization of Iron Oxide-Labeled Stem Cells using Inversion-Recovery With ON-Resonant Water Suppression (IRON)", Magnetic Resonance in Medicine 58:1072-1077 (2007).

Seevinck P.R. et al.: Highly localized positive contrast of small paramagnetic objects using 3D center-out radial sampling with off-resonance reception. In: Magn. Reson. Med, 65, 2011, S. 146-156.

Springer F. et al.: Three-dimensional ultrashort echo time imaging of solid polymers on a 3-Tesla whole-body MRI scanner, in: Invest. Radiol., 43, 2008, S. 802-808.

Boujraf S. et al.: In-vitro quantification of dental filing induced artifacts in dental magnetic resonance imaging using ultrashort echo time (UTE) at 3 Tesla. In: Proc. 17th Annual Meeting ISMRM, 2009, S. 4519.

* cited by examiner a)

b)

METHOD AND MAGNETIC RESONANCE SCANNER FOR HYPERINTENSE DISPLAY OF AREAS IN THE VICINITY OF DIPOLE FIELDS

BACKGROUND OF THE INVENTION

1. Field of the Invention

The present invention relates to a method for the hyperintense display of areas in the vicinity of dipole fields, a magnetic resonance scanner, a computer program and an electronically readable data medium for said program.

2. Description of the Prior Art

The magnetic resonance (MR) technology is a known image modality, with which images of the interior of an object to be examined can be generated. Stated simply, the object to be examined is positioned in a magnetic resonance apparatus in a strong static, homogenous basic magnetic field, also referred to as a $B_0$ field, having field strengths of 0.2 tesla to 7 tesla and higher, such that nuclear spins in the object orient themselves along the basic magnetic field. High frequency excitation pulses (RF pulses) are directed into the object to be examined in order to trigger nuclear magnetic resonances. The triggered resonance signals are measured (detected), and based on such measurements, MR images are reconstructed or spectroscopic data are determined. For spatially encoding the measurement data, rapidly activated magnetic gradient fields are superimposed on the basic magnetic field. The recorded measurement data are digitalized and stored as complex number values in a k-space matrix in a memory. An associated MR image can be reconstructed from the k-space matrix populated with such values, e.g. by means of a multi-dimensional Fourier transformation.

For various medical applications and/or investigations, probes or particles may be used in which magnetically active substances are integrated. In this manner, it is possible for these particles or probes to be verified and localized by means of MR technology.

The magnetically active substances, however, induce a dipole field in their vicinity, which disturbs the otherwise ideally homogenous main magnetic field of the magnetic resonance scanner. This leads to signal losses with gradient echo (GRE) sequences and to distortions (susceptibility artifacts) in spin echo (SE) sequences. The resulting image areas, known as hypointense, image areas, cannot be traced back unambiguously, as a source, to the particles or probes having the integrated, magnetically active substances, because numerous other causes exist for a hypointensity of this sort. For this reason, MR methods are frequently used for verifying and localization of particles or probes of this type that generate a hyperintense contrast, meaning a brighter signal in the vicinity of the dipole field. Methods of this type exploit the fact that the magnetic dipole field of the particle or probe causes magnetic field gradients as well as changes to the proton Larmor frequencies in the immediate vicinity of the disturbance or impediment in order to localize and/or verify the particle or probe.

There are basically two known, different approaches to hyperintense measurement of magnetic impediment particles, i.e. particles having, for example, integrated magnetically active substances. One of these approaches exploits the gradients that exist as a result of the induced dipole field, and the other approach exploits the displacement of the Larmor frequencies in the region of the dipole field.

One example of the first approach noted above is described in Seppenwoolde et al., "Passive Tracking Exploiting Local Signal Conservation: The White Marker Phenomenon," Magnetic Resonance in Medicine 50:784-790 (2003), which presents a GRE based method that exploits the additional dephasing of the spin in the impact area of the disturbance caused by the disturbance gradients for its localization.

An example of the second approach is described in Stuber et al., "Positive Contrast Visualization of Iron Oxide-Labeled Stem Cells using Inversion-Recovery With ON-Resonant Water Suppression (IRON)," Magnetic Resonance in Medicine 58:1072-1077 (2007). With the spectral method presented therein, an expansion of the water frequencies in the impact area of the impurities, caused by the induced dipole field, is exploited in order to localize said impurities. For this purpose, the frequencies of the so-called fat and water peaks are suppressed by means of inversion, such that only signals from the expanded frequency areas are recorded. The signal suppression is combined with a conventional SE or GRE sequence, which allow only echo times that are significantly greater than a millisecond.

In the vicinity of magnetic impurities, e.g. magnetically active substances, long echo times of this type have the disadvantage that, through dephasing or susceptibility artifacts, many of the hyperintense signals are lost that actually should be depicted. Moreover, as a result, other areas are also hyperintensely depicted, lying within the impact area of other magnetic disturbances, such as air bubbles, for example. As a result, it is difficult to differentiate regions of other magnetic disturbances therein, if at all, from hyperintense areas in the vicinity of localizing probes or particles having integrated magnetically active substances.

According to the prior art, pulse sequences are known that enable a very short echo time. One example is the radial UTE sequence ("Ultrashort Echo Time"), as is described in the article by Sonia Nielles-Vallespin, "3D radial projection technique with ultrashort echo times for sodium MRI: Clinical applications in human brain and skeletal muscle," Magn. Res. Med. 2007; 57; pages 74-81. With this sequence type, the start-up, and simultaneous data acquisition is initiated after a waiting period T_delay following a non-selective or slice-selective excitation of the gradients. The k-space trajectory (i.e., the path along which entries of raw data are made into k-space) scanned in this manner, following an excitation, proceeds radially from the k-space center outwardly. For this purpose, a conversion to a Cartesian k-space grid must first be carried out, prior to the reconstruction of the image data from the raw data recorded in k-space, by means of a Fourier transformation of the raw data, e.g. through regridding.

Another approach for enabling short echo times is to scan the k-space by points, in which the free induction decay (FID) is captured. A method of this sort is referred to as single point imaging, because for each RF excitation, basically only one raw data point in k-space is captured. An example of this type of method for single point imaging is the RASP method ("Rapid Signal Point Imaging," O. Heid, M. Meimling, SMR, $3^{rd}$ Annual Meeting, page 684, 1995). According to the RASP method, a raw data point is read out at a fixed point in time after the RF excitation at the "echo time" TE, the phase of which is encoded by gradients. The gradients are changed by means of the magnetic resonance scanner for each raw data point or measurement point, and in this manner k-space is scanned on a point-by-point basis, as is depicted in FIGS. 1a and 1b.

SUMMARY OF THE INVENTION

An object of the present invention is to provide a method, a magnetic resonance scanner, and a non-transitory electronically readable data storage medium that enable a differentiation of hyperintense areas in the vicinity of probes or particles having integrated magnetically active substances from hyperintense areas in the vicinity of other disturbances.

The object is attained according to the invention by a method for the hyperintense display of areas in the vicinity of dipole fields, such as those caused, for example, by particles of magnetically active substances, in an area to be examined located in a measurement volume of a magnetic resonance scanner, wherein the measurement data from the area to be examined are stimulated and detected by means of a pulse sequence that is configured to produce an echo time of less than one millisecond, and to cause a suppression of undesired signals.

Through the combination of the suppression of undesired signal contributions for obtaining the desired hyperintense signals and the use of sequences having an ultrashort echo time TE of less than one millisecond (e.g. TE <500 µs), susceptibility disturbances and dephasings have only a very limited effect on the measurement, and the signal strength is particularly high due to the low degree of dephasing, as a result of which, the quality of the measurement is improved and a higher signal-to-noise ratio (SNR) is obtained. The method according to the invention is based on the insight that disturbances other than those caused by magnetically active substances can have only a limited effect on the measurement within the ultrashort echo time that is used. In this manner, hyperintense areas in the vicinity of probes or particles having integrated magnetically active substances can be more readily differentiated from hyperintense areas in the vicinity of other disturbances.

In one embodiment of the present invention, a UTE sequence is used for recording the measurement data.

In one embodiment of the present invention, a sequence is used for acquiring the measurement data that includes the following steps:
  a) Activation of at least two phase encoding gradients, each in a spatial plane, by operation of a gradient system of the magnetic resonance scanner,
  b) after obtaining the full strength of the activated phase encoding gradients, the emission of a non-slice selective RF excitation pulse by an RF transmitter-receiver device of the magnetic resonance scanner,
  c) following a time period t1, which is greater or equal to the minimum switching time between a transmission mode and a receiving mode of the RF transmitter-receiver device after the last emitted excitation pulse, detection of echo signals by the RF transmitter-receiver device, and storage of the echo signals as raw data points along the radial k-space trajectory predetermined by the strength of the phase encoding gradients,
  d) repetition of steps a) through c) with different phase encoding gradients until k-space corresponding to the examined area that is to be imaged has been read out in a first area, dependent on the time period t1, along the radial k-space trajectories, and
  e) readout of k-space corresponding to the examination area that is to be imaged, which is not covered by the first area of the k-space, and which comprises at least the center of the k-space, in a manner different from that described by the steps a) through d).

Through the activation of the phase encoding gradients, and waiting until the activated phase encoding gradients have reached their full strength, before the echo signals have been produced with the RF transmitter and detected, i.e. the acquisition of measurement data has been initiated, the echo time, (the time between excitation by an RF excitation pulse and the initiation of the acquisition of measurement data), can be reduced in comparison to a UTE sequence, in the entire radial k-space that is to be scanned. This shall be explained in greater detail below with respect to FIG. 5. In this manner, echo signals from substances having a very short T2 can also be captured, and the repetition time, the time between two RF excitation pulses, can also be reduced accordingly. Furthermore, the measurement is less subject to disturbances such as, for example, eddy currents induced in the gradient system during the modification of the current applied thereto, because measurements of the phase encoding gradients are not taken during the start-up ("ramps"). For this reason, measurement data can be more precisely recorded.

Because only one area, which corresponds to the center of the k-space, is read out in a different manner than the radial part in the first area, the overall measurement time, until the entire k-space corresponding to the imaging area has been measured, is significantly shortened, e.g. in comparison with pure single point imaging methods.

In an embodiment, the area that includes the k-space center ($k_x=0$, $k_y=0$, $k_z=0$) necessary for the image reconstruction (contrast) is read out in a Cartesian manner, e.g. by means of a single point imaging method, such as RASP. As a result, the precision of the scanning of the k-space center and, if applicable, a region surrounding the k-space center can be increased in k-space, because the raw data entered therein already lie on a Cartesian k-space grid, and do not first have to be converted such a grid, in a procedure that may be subject to error, before image data can be constructed from the raw data.

In summary, through the combination of radial and Cartesian scanning of the k-space, a particularly quick method (short measuring period overall) with particularly short echo times is achieved (so the depiction of tissues having short T2 values is possible).

In another advantageous embodiment, the elapsed time period t1, following the last emitted excitation pulse until the recording of the echo signals is initiated, is the same as the minimum switching time $TE_{HW}$ between the transmission mode and the receiving mode of the RF transmitter-receiver device. The reduction of the echo time t1 therefore is limited only by a hardware constant, namely the switching time $TE_{HW}$, with the present invention.

The above object also is achieved in accordance with the present invention by a non-transitory, computer-readable data storage medium encoded with programming instructions/commands that, when loaded into a computerized control and evaluation system of a magnetic resonance apparatus cause one or more of the above-described embodiments of the method according to the invention to be implemented.

DESCRIPTION OF THE PREFERRED EMBODIMENTS

Figure 1:
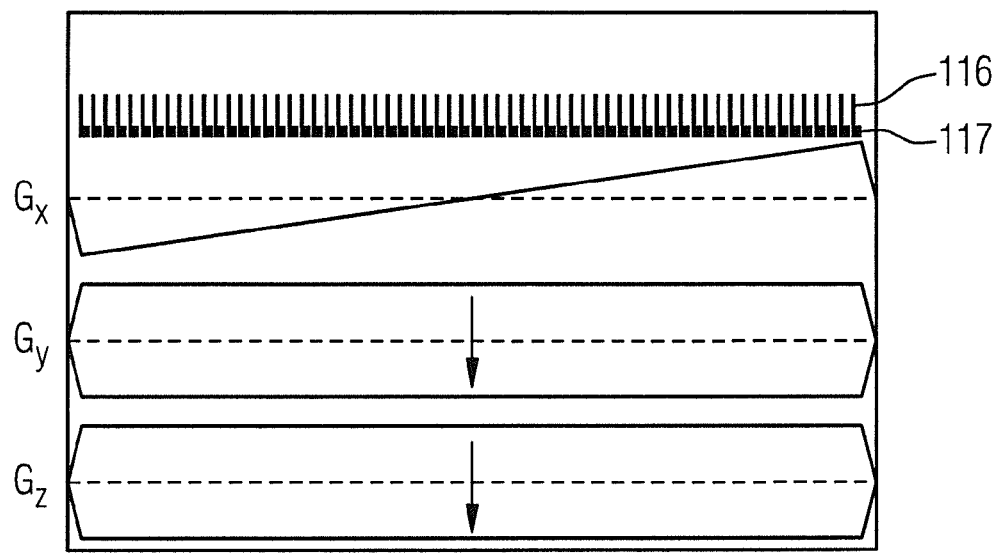
FIG. 1 schematically depicts the single point method RASP known from the prior art.
Figure 1:
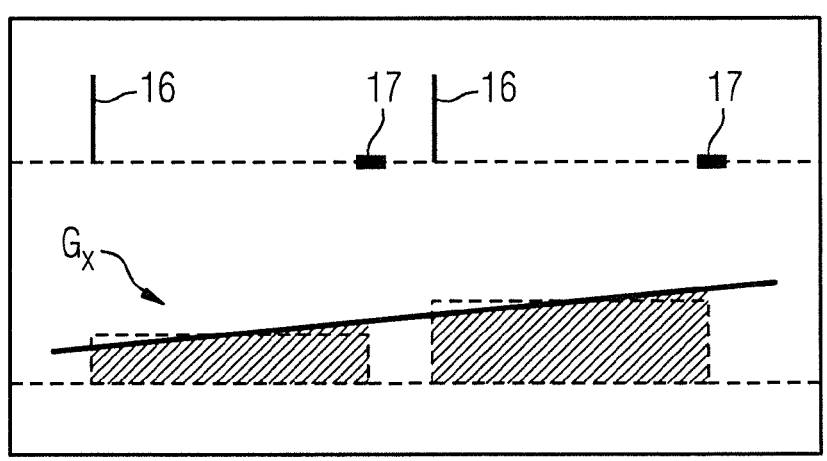

A sequence for capturing (acquiring data entries for) a line in the k-space is depicted at (a) in FIG. 1. It can be seen that the two phase encoding gradients $G_y$ and $G_z$ are activated with a constant strength, while the strength of the third phase encoding gradient $G_x$ is continuously increased.

In (b) of FIG. 1, the capturing of two raw data points is depicted in detail. It can be seen that the echo time, i.e. the temporal spacing, is constant from the RF excitation pulse 16 up to the beginning of the scanning timespan 17. In addition, the phase encoding gradient $G_x$ runs in incremental steps from down to up. In doing so, the phase encoding gradient $G_x$ for scanning a raw data point is kept constant, which means that the phase encoding gradient $G_x$ is kept constant for the timespan TE (echo time).

Figure 2:
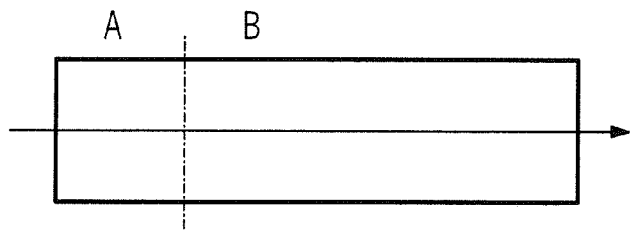
FIG. 2 schematically shows the subdivisions of a pulse sequence according to the invention.

FIG. 2 depicts, in a schematic manner, how a sequence suitable for the method according to the invention can be subdivided. For each imaged part B, in which the measurement signals are recorded, a part A, which suppresses undesired signals, is activated, which is repeated as often as necessary in order to capture all desired measurement data. As an example, a spectrally selective saturation pulse is activated in area A, prior to activating the excitation pulse of the sequence for the recording of the measurement data (area B). Just one or numerous excitation pulses, e.g. five to twenty excitation pulses, as well, with subsequent measurement data recordings, can be activated. Depending on how many excitation pulses and recordings of measurement data are executed in part B, before another suppression of undesired signals is again carried out in a next part A, the overall time is shortened proportionately. The number of excitation pulses, and therefore the number of recordings of measurement data that occur in part B, can be selected, for example, based on how often a part A is necessary in order to sufficiently suppress the undesired signals.

Figure 3:
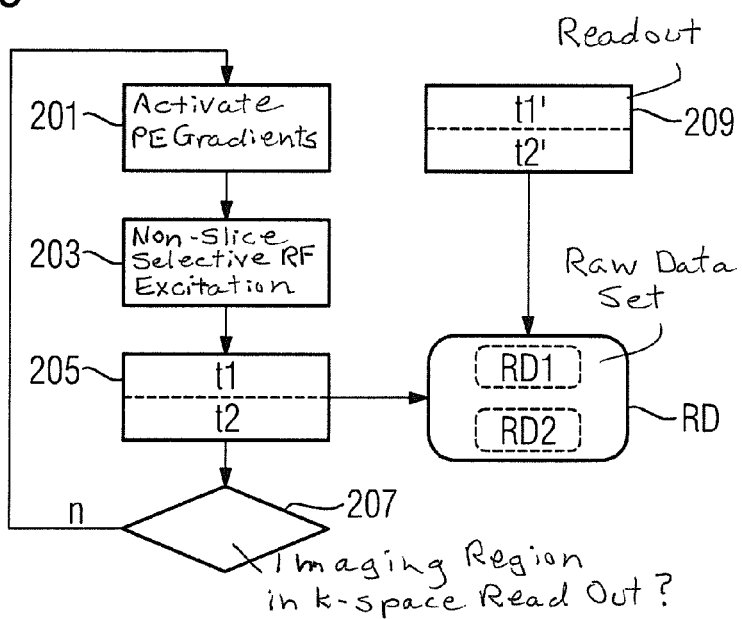
FIG. 3 is a flowchart of an example of a sequence according to the invention.

FIG. 3, a flowchart is depicted for a sequence suitable for the method according to the invention.

In this sequence, a k-space corresponding to the imaging region is read out for the creation of the recording of the measurement data.

For this purpose, at least two phase encoding gradients ($G_x$, $G_y$, $G_a$), in respective spatial planes, are activated by means of a gradient system of the magnetic resonance scanner (block 201) and a non-slice selective RE excitation pulse is emitted by means of an RF transmitter-receiver device (block 203). If three phase encoding gradients are activated, then a three-dimensional image data set can be reconstructed from the recorded raw data in a conventional manner. If only two phase encoding gradients are activated, a projection data set can be reconstructed, as shall be explained below, in detail based on FIG. 6.

As indicated in block 205, after a time period t1, following the last emitted excitation pulse, in which the phase encoding gradients activated in block 201 have already reached their full strength, echo signals are recorded by means of the RF transmitter-receiver device, and stored as raw data points along the radial k-space trajectory determined by the strength of the phase encoding gradients in an evaluation unit of the magnetic resonance scanner as a raw data set RD.

In one embodiment, echo signals are recorded only after the time period t1, and saved (stored) as raw data in the raw data set RD. In another embodiment, first echo signals are recorded after the time period t1 following each RF excitation pulse, and saved as raw data in a first raw data set RD1, and then at least one second echo signal is recorded after a time period t2 following the same RF excitation pulse, and saved as another raw data point in a second raw data set RD2, with t2>t1. The second echo signal is generated thereby in a known manner, e.g. through reversing the polarity of the gradients.

After all desired echo signals following an RF excitation pulse are recorded and the corresponding k-space trajectories are read out, it is checked in step 207 as to whether or not the k-space corresponding to the imaging region in one of the first regions dependent on the time period t1 has already been read out along radial k-space trajectories. If not ("n") then the procedure is begun anew at block 201, wherein phase encoding gradients are activated, which differ from the phase encoding gradients used so far.

The portion of k-space corresponding to the imaging region that is not covered by the first region of k-space (the first region having been scanned by blocks 201 through 205), is read out at an arbitrary point in time, or at different points in time as well, prior to, in between, or after the reading out (block 209) of the radial k-space trajectories. This readout in block 209 is implemented, e.g. point-by-point by means of a single point imaging procedure, such as RASP, for example, or using other known methods, and is likewise saved in a raw data set RD. If the raw data points containing the k-space are captured in a Cartesian manner, a so-called regridding before the reconstruction of the image data becomes unnecessary.

In the reading out of k-space corresponding to the imaging region, the phase encoding gradients are continuously changed between the emission of a first RF excitation pulse, for recording raw data points of the k-space corresponding to the imaging region, and a second RF excitation pulse, for recording further raw data points of the k-space corresponding to the imaging region. This means that the phase encoding gradients are not completely deactivated (absent) after each recording (acquisition) of a radial k-space trajectory, and started up anew for the recording of the next k-space trajectory, but rather the phase encoding gradients are increased or decreased from the already existing strength (magnitude) until they have obtained the strength required for the next recording. In this manner the eddy currents, induced through the generation of current by the operation of the gradient system that is necessary for the phase encoding gradients, can be reduced. This reduces the development of noise caused by Lorentz forces resulting from the interaction of the eddy currents and the gradient system fields.

It is advantageous to organize the k-space trajectories that are to be read out in such a manner that the strength of the phase encoding gradients need only be changed slightly for each trajectory (i.e., from trajectory-to-trajectory), so that the noise caused by the change of the phase encoding gradients in the measurement volume M of the magnetic resonance scanner can be further reduced.

Analogous to the embodiment examples explained above, the raw data points read out by other means, e.g. by single point imaging methods, that includes the center of k-space, can also, following each RF excitation pulse, either be read out only after a first echo time t1' of a first raw data point and stored in the first raw data set RD1, or after a first echo time t1' A first raw data point can be read out and saved in the first raw data set RD1, and after a second echo time t2', where t1'<t2', a second raw data point can be read out and saved in the second raw data set RD2. The generation of the second echo is carried out, again, in a known manner.

Figure 4:
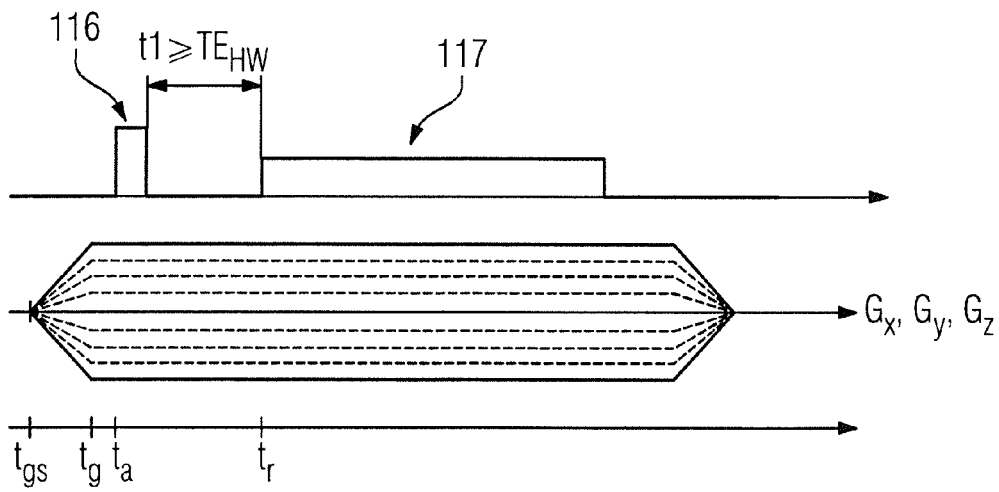
FIG. 4 schematically shows a portion of a sequence for capturing numerous raw data points on a radial k-space trajectory, which can be implemented with the method according to the invention, FIG. 5 schematically illustrates a magnetic resonance scanner according to an embodiment of the present invention.

The partial sequence serving to capturing numerous raw data points on a radial k-space trajectory is depicted schematically in FIG. 4, as it can be implemented in the method according to the invention (cf. FIG. 3, blocks 201-205). At a point in time $t_{gs}$ at least two phase encoding gradients $G_x$, $G_y$, $G_z$ are activated and obtain their full strength at a point in time $t_g$. At a later point in time $t_a > t_g$, an RF excitation pulse 116 is emitted. After an echo time t1 following the RF excitation pulse 116, corresponding to the minimum switching time between a transmitting mode and a receiving mode of an RF transmitter-receiver device $TE_{HW}$ dictated by the hardware thereof, the read out time span 117 for reading out the echo signal is initiated at the point in time $t_r$.

In the embodiment examples depicted in FIG. 4, the phase encoding gradients are activated before the RF excitation pulse is emitted.

The sequence described using FIGS. 3 and 4 for recording measurement data enables particularly short echo times of even less than 500 microseconds (TE ≤500 µs).

Figure 5:
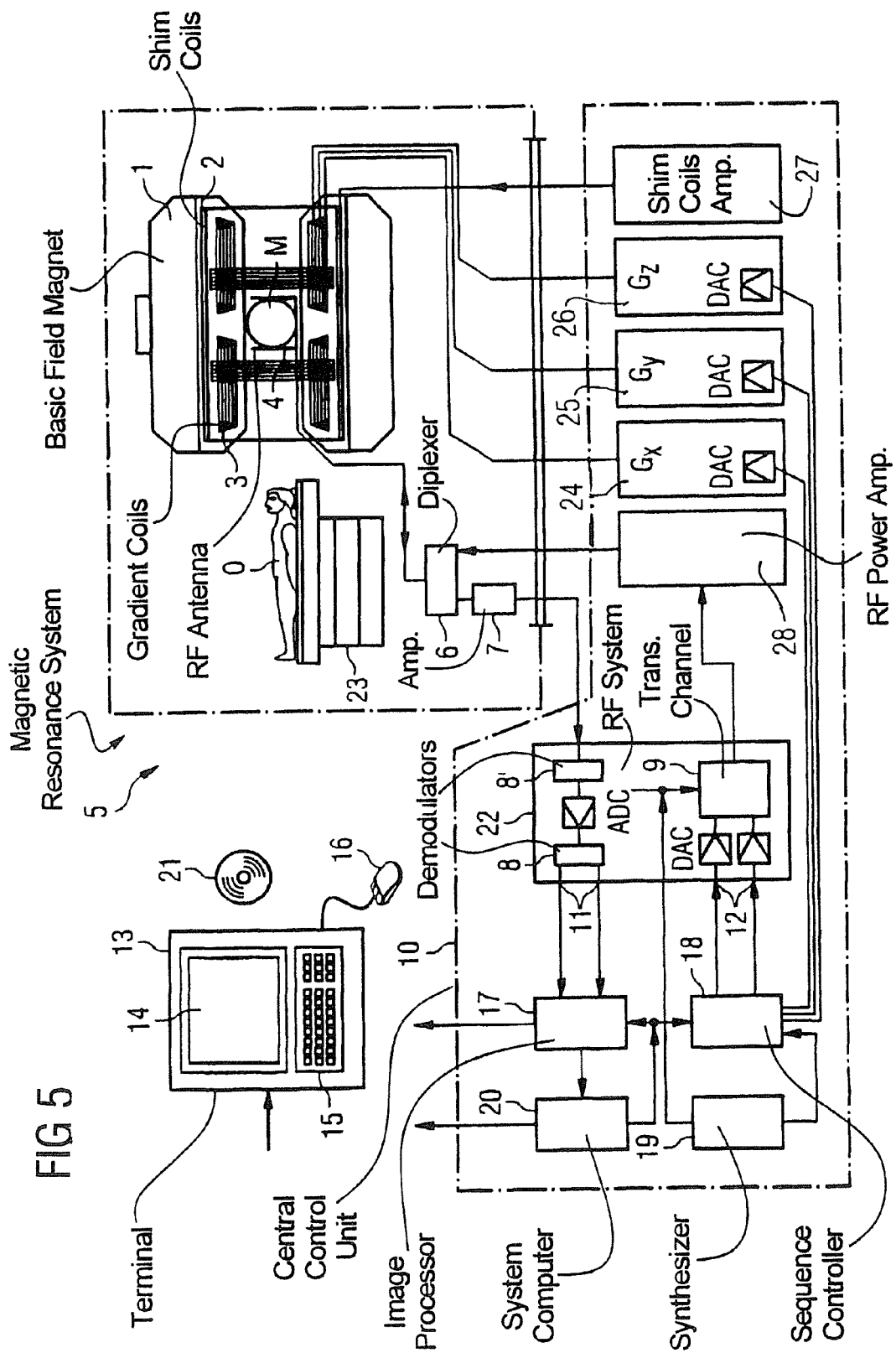

FIG. 5 is a schematic depiction of a magnetic resonance scanner 5 (a magnetic resonance imaging or nuclear spin tomography apparatus). A basic field magnet 1 generates a basic magnetic field having a temporally constant strength for the polarization or uniform orientation of the nuclear spins in an examination region of an object to be examined U, such as, for example, a part of a human body that is to be examined, which lies on a table 23 and is moved into the magnetic resonance scanner 5. The degree of homogeneity of the basic magnetic field necessary for the magnetic resonance measurement (data acquisition) is defined in a typically spherical measurement volume M, in which the part of the human body to be examined is inserted. To support the requirements of homogeneity and in particular, to eliminate temporally invariable effects, so-called shim plates, made of a ferromagnetic substance, which are adjustable where applicable, are applied at suitable locations. Temporally variable effects are eliminated by means of shim coils 2 and a shim coil amplifier 27 for the shim coils 2.

A cylindrical gradient coil system 3 is built into the basic magnet 1, composed of three sub-windings. Each sub-winding is supplied with current for the generation of a linear gradient field in the respective plane of a Cartesian coordinate system by a corresponding amplifier 24-25. The first sub-winding of the gradient field system 3 generates thereby a gradient $G_x$ on the x-axis, the second sub-winding generates a gradient $G_y$ on the y-axis, and the third sub-winding generates a gradient $G_z$ on the z-axis. The amplifiers 24-26 each include a digital-analog converter (DAC), which is controlled by a sequence control 18 for the generation of gradient pulses at the proper times.

A radio-frequency (RF) antenna 4 is located within the gradient field system 3, which converts the RF pulses provided by an RF amplifier 28 for the excitation of the nuclear spin of the object to be examined, or the region to be examined of this object. These RF pulses deflect the nuclear spins out of the orientation imposed by the basic magnetic field by an angle known as the "flip angle." The RF antenna 4 is composed of one or more RF transmitter coils and numerous RF receiver coils in the form of, for example, an annular, linear or matrix shaped configuration of coils. The alternating field emitted by the now-precessing nuclear spins, i.e. normally the spin echo signal caused by a pulse sequence of one or more RF pulses and one or more gradient pulses, is converted to a voltage (measurement signal), which is fed to an RF receiver channel 8, 8' of an RF system 22 via an amplifier 7. The RF system 22 additionally has a transmit channel 9, in which the RF pulses for the excitation of the nuclear spins are generated. In doing so, the respective RF pulses are represented digitally in the sequence control 18 as a series of complex numbers based on a pulse sequence predetermined by the system computer 20. This number series is fed as real and imaginary parts via respective inputs 12 of a digital-analog converter (DAC) to the RF system 22 and from this RF system to the transmit channel 9. The pulse sequences are modulated to an RF carrier signal, the base frequency of which corresponds to the resonance frequency of the nuclear spins in the measurement volume. The modulated pulse sequences of the RF transmitter coil are fed to the RF antenna 4 via an amplifier 28.

The switching from transmit to receive mode is carried out via a diplexer 6. The RF transmitter coil of the RF antenna 4 radiates the RF pulses for the excitation of the nuclear spins in the measurement volume M and detect resulting echo signals via the RF receiver coils. The accordingly obtained magnetic resonance signals are demodulated to an intermediate frequency in a first demodulator 8' of the receiver channel of the RF system 22, in a phase-dependent manner, and are digitized in the analog-digital converter (ADC). This signal is then demodulated to the frequency zero. The demodulation to the frequency zero and the separation into real and imaginary parts takes place after the digitization in the digital domain in a second demodulator 8, which emits the demodulated data via outputs 11 to an imaging computer 17. An MR image is reconstructed from the measurement data obtained in this manner by the image computer 17. The management of the measurement data, the image data and the control programs is carried out by the system computer 20. Based on a command with control programs, the sequence control 18 controls the generation of the respective desired pulse sequences and the corresponding scanning of k-space. In particular, the sequence control 18 controls thereby the frequency region that is to be saturated for suppressing undesired signals, the activation of the gradients at the proper time, the radiation of the RF pulses with defined phase amplitudes, and the reception of the magnetic resonance signals. The time base for the RF system 22 and the sequence control 18 are made available by a synthesizer 19. The selection of appropriate control programs for generating an MR image, which, for example, are stored on a DVD 21, as well as other user inputs and the depiction of the generated MR image, are carried out via a terminal 13. The terminal 13 has an input means for enabling user entries, such as a keyboard 15, for example, and/or a mouse 16, and a display for enabling a display, such as a monitor 14, for example. A user can also select the signals that are to be suppressed using the input means, for example.

Figure 6:
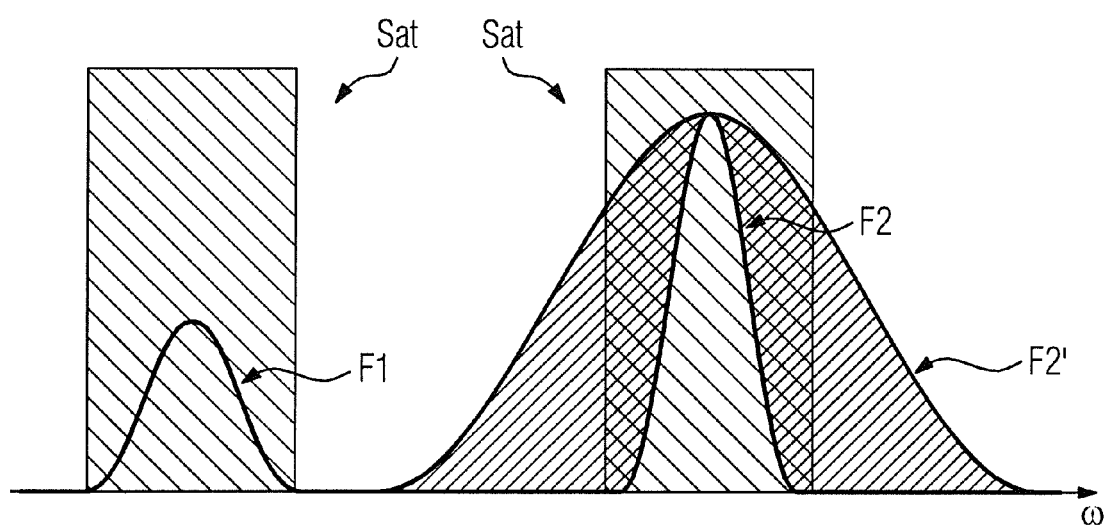
FIG. 6 shows an example of signals from fat and water in the frequency domain.

FIG. 6 illustrates in an exemplary manner the signals from two different substances, e.g. fat and water in the frequency domain ω. The signal of the first substance F1 rises and falls over a certain range of the frequency domain ω in a Gaussian manner. For the purpose of suppressing this signal, the corresponding frequency range (crosshatched area) can be suppressed ("Sat"). The signal of the second substance F2 also rises and falls in a Gaussian manner in another region of the frequency domain ω. The continuous line F2 indicates thereby the signal of the second substance, in which resonant signals are present. The broken line F2' indicates an expanded frequency range of the second substance, in which off-resonant signals are present. Off-resonant signals of this type are caused, for example, by impediments described above, e.g. by a displacement of the Larmor frequencies in the range of the dipole field of an impediment. In order to be able to record, for example, the signals that are caused only by the impediments, the frequency range of the resonant signals can in turn be suppressed, as is indicated by the crosshatched area ("Sat").

The suppression of the undesired signals can be achieved, for example, by means of so-called spectral saturation pulses, which, for example, already excite with a corresponding frequency-offset during the excitation, and/or by means of appropriate so-called spoiler gradients, which dephase the spectrally selective excited signals from the frequency range that is to be suppressed. In this manner, water signals, for example, can be suppressed from the resonant region (see above) such that only water signals from the off-resonant region are captured, which could not otherwise be detected due to the brighter water signal from the resonant region. The signals from the off-resonant regions demarcate a location in which a magnetically active substance is present, which is responsible for the existence of the off-resonant signals. Other potentially disrupting substances, such as fat, for example, can also be suppressed by means of spectral saturation pulses of this type.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of displaying hyperintense magnetic resonance (MR) signal sources in a reconstructed MR image of a subject, comprising:

using a control computer in order to operate an MR data acquisition scanner with a pulse sequence and acquire MR data, with the MR data including hyperintense MR signals acquired during an echo time of the pulse sequence that is less than one millisecond, from nuclear spins within the subject that act as a source of the hyperintense MR signals; a subject is situated inside the MR data acquisition scanner, wherein said source of the hyperintense MR signals; is also within an extent of influence being generated by a magnetically active dipole that imparts both a magnetic susceptibility disturbance and a dephasing onto said nuclear spins that act as the source of said hyperintense MR signals;

in said control computer, formulating said pulse sequence in order to cause said echo time of the pulse sequence to be less than a millisecond, and in order to also suppress an acquisition of undesired signals occurring in said acquired MR data, in at least a predetermined MR signal frequency range, and whereby the less than a millisecond echo time of the pulse sequence prevents both the dipole imparted magnetic susceptibility disturbance and said dephasing from having the time required to degrade said hyperintense MR signals down to an extent that precludes an unambiguous visualization of said hyperintense MR signal source in an MR image that is reconstructed from said acquired MR data; and in a processor, reconstructing said MR image from said acquired MR data, with said hyperintense MR signal source being unambiguously visualized in said reconstructed MR image, as a direct result of the echo time being less than 1 millisecond in the formulated pulse sequence and making said reconstructed MR image available from said processor in electronic form as a data file.

2. A method as claimed in claim 1 comprising operating said MR data acquisition scanner with an ultrashort echo time (UTE) sequence as said pulse sequence.

3. A method as claimed in claim 1 comprising operating said MR data acquisition scanner with said pulse sequence comprising:

(a) activating at least two phase encoding gradients, each in a respective spatial plane, by operating a gradient system of said MR data acquisition scanner, each of said at least two phase encoding gradients, exhibiting a gradient strength that eventually reaches full strength;

(b) after said activated phase encoding gradients reach said full strength, stimulating said nuclear spins by radiating a non-slice selective radio-frequency RF excitation pulse from an RF transmitter/receiver device of said magnetic resonance data acquisition scanner, said RF transmitter/receiver device being operable in a transmission mode and a receiving mode and exhibiting a minimum switching time between operation in said transmission mode and operation in said receiving mode;

(c) following a time period that is greater than or equal to said minimum switching time, and after emission of said non-slice selective RF excitation pulse, detecting said echo signals with said RF transmitter/receiver device and storing said echo signals as raw data points in k-space along a radial k-space trajectory that is determined by the strength of the respective phase encoding gradients;

(d) repeating steps (a) through (c) with different phase encoding gradients until a k-space corresponding to said area in said vicinity of said active dipole field has been readout as a first area of k-space, dependent on said time period of step (c), along said stored radial k-space trajectories of step (c); and (e) reading out k-space corresponding to said examination area, which is not covered by said first area of k-space, and which comprises at least a center of k-space, with a readout procedure that is different from steps (a) through (d) and comprises either reading out the raw data points in step (e) as Cartesian raw data points, or reading out the raw data points in step (e) using a single point imaging method.

4. A method as claimed in claim 3 comprising reading out the stored raw data points in kspace from step (c) in the reading out of kspace step (e) as Cartesian raw data points.

5. A method as claimed in claim 3 comprising reading out the stored raw data points in kspace from step (c) in the reading out of kspace step (e) using a single point imaging method.

6. A method as claimed in claim 1 comprising suppressing fat signals as part of the suppressed acquisition of said undesired signals.

7. A method as claimed in claim 1 comprising suppressing water signals as part of the suppressed acquisition of said undesired signals.

8. A method as claimed in claim 7 comprising suppressing said water signals only in a sub-range that comprises frequencies of said water signals.

9. A method as claimed in claim 8 comprising suppressing said water signals in said sub-range comprises the frequencies of on-resonant water signals.

10. A magnetic resonance (MR) apparatus configured for displaying hyperintense MR signal sources in an MR image of a subject, said MR apparatus comprising:

an MR data acquisition scanner;

a control computer configured to operate said MR data acquisition scanner with a pulse sequence that acquires MR data, which includes hyperintense MR signals acquired during an echo time of the pulse sequence that is less than one millisecond, from nuclear spins within the subject that act as a source of the hyperintense MR signals when a subject is situated inside the MR data acquisition scanner, wherein said source of the hyperintense MR signals is also within an extent of influence being generated by a magnetically active dipole that imparts both a magnetic susceptibility disturbance and a dephasing onto said nuclear spins that act as the source of said hyperintense MR signals;

said control computer being configured to formulate said pulse sequence in order to cause said echo time of the pulse sequence to be less than a millisecond, and in order to also suppress an acquisition of undesired signals occurring in said acquired MR data in at least predetermined MR signal frequency range, and whereby the less than a millisecond echo time of the pulse sequence prevents both the dipole imparted magnetic susceptibility disturbance and said dephasing from having the time required to degrade said hyperintense MR signals down to an extent that precludes an unambiguous visualization of said hyperintense MR signal source in an MR image that is reconstructed from said acquired MR data; and a processor configured to reconstruct said MR image from said acquired MR data, with said hyperintense MR signal source being unambiguously visualized in said reconstructed MR image, as a direct result of the echo time being less than 1 millisecond in the formulated pulse sequence and in order to make said reconstructed MR image available from said processor in electronic form as a data file.

11. A non-transitory, computer-readable data storage medium encoded with programming instructions, said storage medium being loaded into a computerized control and evaluation system of a magnetic resonance (MR) apparatus that also comprises an MR data acquisition scanner, said programming instructions when executed causing said computerized control and evaluation system to do the following:

operate said MR data acquisition scanner with a pulse sequence that acquires MR data, which includes hyperintense MR signals acquired during an echo time of the pulse sequence that is less than one millisecond, from nuclear spins within the subject that act as a source of the hyperintense MR signals when a subject is situated inside the MR data acquisition scanner, wherein said source of the hyperintense MR signals is also within an extent of influence being generated by a magnetically active dipole that imparts both a magnetic susceptibility disturbance and a dephasing onto said nuclear spins that act as the source of said hyperintense MR signals;

formulate said pulse sequence in order to cause said echo time of the pulse sequence to be less than a millisecond, and in order to also suppress an acquisition of undesired signals occurring in said acquired MR data in at least a predetermined MR signal frequency range, and whereby the less than a millisecond echo time of the pulse sequence prevents both the dipole imparted magnetic susceptibility disturbance and said dephasing from having the time required to degrade said hyperintense MR signals down to an extent that precludes unambiguous visualization of said hyperintense MR signal source in an MR image that is reconstructed from said acquired MR data; and reconstruct said MR image from said acquired MR data, with said hyperintense MR signal source being unambiguously visualized in said reconstructed MR image, as a direct result of the echo time being less than 1 millisecond in the formulated pulse sequence and in order to make said reconstructed MR image available from said processor in electronic form as a data file.

* * * * *